United States Patent
Kuno

(10) Patent No.: US 6,815,943 B2
(45) Date of Patent: Nov. 9, 2004

(54) ELECTRIC COMPONENT TEST SYSTEM AND ELECTRIC COMPONENT TEST METHOD

(75) Inventor: Kimio Kuno, Tokyo-To (JP)

(73) Assignee: Advantest Corporation, Tokyo-To (JP)

(*) Notice: Subject to any disclaimer, the term of this patent is extended or adjusted under 35 U.S.C. 154(b) by 0 days.

(21) Appl. No.: 10/416,730

(22) PCT Filed: Sep. 17, 2002

(86) PCT No.: PCT/JP02/09513
§ 371 (c)(1),
(2), (4) Date: May 14, 2003

(87) PCT Pub. No.: WO03/025612
PCT Pub. Date: Mar. 27, 2003

(65) Prior Publication Data
US 2004/0032249 A1 Feb. 19, 2004

(30) Foreign Application Priority Data
Sep. 14, 2001 (JP) .................................. 2001-279356

(51) Int. Cl.[7] .............................................. G01R 27/00
(52) U.S. Cl. ................................. 324/158.1; 324/76.61
(58) Field of Search ........................... 324/158.1, 76.61, 324/500, 211, 512, 555, 528, 531; 714/718, 719

(56) References Cited

U.S. PATENT DOCUMENTS 6,304,502 B1 * 10/2001 Watanabe et al. ........... 365/201
6,347,386 B1 * 2/2002 Beffa .......................... 714/718

FOREIGN PATENT DOCUMENTS

| JP | 60-14303 A | 1/1985 |
| JP | 2-227679 A | 9/1990 |
| JP | 6-281692 A | 10/1994 |
| JP | 2001-43109 A | 2/2001 |

* cited by examiner

*Primary Examiner*—Luan Thai
*Assistant Examiner*—Trung Q. Nguyen
(74) *Attorney, Agent, or Firm*—Birch, Stewart, Kolasch & Birch, LLP

(57) ABSTRACT

An electric parts testing system comprises a testing unit to test electric parts for individual condition identifiers assigned for identification of a plurality of test conditions different from each other; a first memory unit which previously stores estimated causes in relation at least to each said condition identifier, said estimated causes being obtained by estimation as causes of defectiveness of the electric parts; a second memory unit to store at least one or more of the condition identifiers regarded as fault-connected identifiers when any of the electric parts are judged to be defective; and an arithmetical unit to calculate a parameter when there are a plurality of said fault-connected identifiers, said parameter being related to the fault-connected identifiers at least for each said estimated cause related to the fault-connected identifiers.

17 Claims, 14 Drawing Sheets

| TEST NUMBERS | FAULT-ESTIMATED BOARD REGION 1 | FAULT-ESTIMATED BOARD REGION 2 | FAULT-ESTIMATED BOARD REGION 3 |
|---|---|---|---|
| Test 1 | 40C (50%) | 40A (30%) | 40B (20%) |
| Test 2 | 50B (50%) | 40C (20%) | 50A (15%) |
| Test 3 | 50B (60%) | 60C (30%) | 60B (5%) |
| Test 4 | 70C (35%) | 60C (30%) | 60B (20%) |
| Test 5 | 80A (30%) | 70C (20%) | 60C (15%) |
| Test 6 | 80A (95%) | 90A (3%) | 90B (1%) |
| Test 7 | 60C (45%) | 50B (20%) | 90C (20%) |

FIG. 4

| Fail Test No. | 50B | 60C | 60B | 70C | 80A | 90C |
|---|---|---|---|---|---|---|
| Test 3 | ✶(60%) | ✶(30%) | ✶(50%) | / | / | / |
| Test 4 | / | ✶(30%) | ✶(20%) | ✶(35%) | / | / |
| Test 5 | / | ✶(15%) | / | ✶(20%) | ✶(30%) | / |
| Test 7 | ✶(20%) | ✶(45%) | / | / | / | ✶(20%) |
| PARAMETER 1 (NUMBER OF FAIL TEST NUMBERS) | 2 | 4 | 2 | 2 | 1 | 1 |
| PARAMETER 2 (%) | 80 | 120 | 25 | 55 | 30 | 20 |

FIG. 6

|  | FAULT-ESTIMATED BOARD REGION | PARAMETER 1 (NUMBER OF FAIL TEST NUMBERS) | PARAMETER 2 (%) |
|---|---|---|---|
| Bad | 60C | 4 | 120 |
| Doubtful | 50B | 2 | 80 |
| Doubtful | 70C | 2 | 55 |
| Doubtful | 80A | 2 | 30 |
| Doubtful | 60B | 1 | 25 |
| Doubtful | 90C | 1 | 20 |

FIG. 7

| Fail Test No. | 70C | 60C | 60B | 80A | 50B | 90C |
|---|---|---|---|---|---|---|
| Test 4 | *(35%) | *(30%) | *(20%) | / | / | / |
| Test 5 | *(20%) | *(15%) | / | *(30%) | / | / |
| Test 7 | / | *(45%) | / | / | *(20%) | *(20%) |
| PARAMETER 3 (NUMBER OF FAIL TEST NUMBERS) | 2 | 3 | 1 | 1 | 1 | 1 |
| PARAMETER 4 (%) | 55 | 90 | 20 | 30 | 20 | 20 |

FIG. 9

| | FAULT-ESTIMATED BOARD REGION | PARAMETER 5 (NUMBER OF FAIL TEST NUMBERS) | PARAMETER 6 (%) |
|---|---|---|---|
| Bad | 60C | 7 | 210 |
| Doubtful | 70C | 4 | 110 |
| Doubtful | 50B | 3 | 100 |
| Doubtful | 80A | 2 | 60 |
| Doubtful | 60B | 3 | 45 |
| Doubtful | 90C | 2 | 40 |

FIG. 10

ELECTRIC COMPONENT TEST SYSTEM AND ELECTRIC COMPONENT TEST METHOD

This application is the national phase under 35 U.S.C. §371 of PCT International Application No. PCT/JP02/09513 which has an International filing date of Sep. 17, 2002, which designated the United States of America.

TECHNICAL FIELD

This invention relates to an electric parts testing system and an electric parts testing method.

BACKGROUND ART

In the semiconductor testing process, a semiconductor testing system examines semiconductor devices or the like (hereinafter called DUT (device under test) as well) under test according to various predetermined conditions. Such a semiconductor testing system contains a number of electric parts such as a DUT board, performance board and motherboard for testing DUTs, etc. To ensure accurate measurement of DUTs, etc. by a semiconductor testing system, it is essential that those boards and other electric parts inside the semiconductor testing system operate accurately.

Some conventional semiconductor testing systems additionally contain self-diagnostic devices for testing their own electric parts contained in the systems.

Such self-diagnostic devices supply predetermined quantities of electric power at predetermined timings to individual electric parts inside the semiconductor testing system, or to selective portions of certain electric parts inside the semiconductor system, under predetermined test conditions. Thereafter, the self-diagnostic device observes outputs from those electric parts, or from the selective portions of the electric parts, and determines whether or not those outputs meet predetermined result conditions. If any of the outputs does not meet its result condition, then the self-diagnostic device notifies the user that the corresponding electric part did not satisfy the result condition. In other words, the self-diagnostic device notifies the user that the electric part was judged to be defective.

A number of test conditions are usually related to different test items to distinguish the conditions from each other. Therefore, in most cases, the self-diagnostic device notifies the user of a defective electric part by means of a test item instead of describing its test condition. Then the user can know the test condition used upon judgment of a defect or fault from the test item.

In general, a plurality of test conditions are related to each electric part. Therefore, when a certain electric part is defective, its defectiveness may be pointed out in more than one test item. Similarly, a single test item relates to the defectiveness of a plurality of parts. Therefore, even with a judgment of defectiveness for a test item and a test condition, it is difficult for the user to know which electric part is actually defective.

Such a self-diagnostic device was heretofore contained in a semiconductor testing system. Then, data on the causes of the defectiveness, test items and test conditions connected to the past judgment of defectiveness were stored. The self-diagnostic device showed the user the actual testing results of a particular electric part selected from the data as having been most often judged to be defective according to a selected test item.

However, the electric part most often judged to be defective by a single test item was typically a low quality electric part or a part more commonly used in a semiconductor testing system as compared with other electric parts. In other words, among various kinds of electric parts that otherwise have the same rate of defectiveness, the electric parts used most in the semiconductor testing system were more likely to become defective than the less commonly used electric parts. In addition, electric parts inferior in quality were also more likely to become defective than the other electric parts.

Heretofore, therefore, the self-diagnostic device always showed the user the most commonly used electric part in the semiconductor testing system or a poor quality electric part as being most likely the cause of defectiveness.

As stated above, in general, each electric part is related to a plurality of test items or test conditions, and each test item or test condition is related to a plurality of different electric parts.

In some cases, the electric part that is the actual cause of defectiveness can be a less commonly used electric part in the semiconductor testing system. In other cases, electric parts having been regarded previously as poor quality parts may have been improved in quality and seldom become defective.

If the self-diagnostic device makes judgments on a cause of defectiveness for a single test item in those cases, it will erroneously show the user an electric part that it is not the true cause of defectiveness.

Further, a long period of time was required for the self-diagnostic device to accumulate and be able to use data of actual results of the past causes of defectiveness and actual results of electric parts that have been causes of defectiveness. Therefore, it took a long time after initial use of the semiconductor testing system until data on actual results became available for actual use.

Moreover, once an electric part in its normal condition was misjudged to be the cause of defectiveness, it took a long time to detect the truly defective electric part.

It is therefore an object of the invention to provide, from the initial use, an electric parts testing system and an electric parts testing method capable of bringing to user's attention an electric part with higher probability of being the cause of defectiveness than the conventional one It is another object of the invention to provide an electric parts testing system and an electric parts testing method capable of detecting the truly defective electric part more quickly than the conventional technique after defectiveness is found by a test of electric parts.

SUMMARY OF THE INVENTION

An electric parts testing system comprises a testing unit to test electric parts for individual condition identifiers assigned for identification of a plurality of test conditions different from each other;
  a first memory unit which previously stores estimated causes in relation at least to each said condition identifier, said estimated causes being obtained by estimation as causes of defectiveness of the electric parts;
  a second memory unit to store at least one or more of the condition identifiers regarded as fault-connected identifiers when any of the electric parts are judged to be defective; and
  an arithmetical unit to calculate a parameter when there are a plurality of said fault-connected identifiers, said parameter being related to the fault-connected identifiers at least for each said estimated cause related to the fault-connected identifiers.

Said parameter is preferred to the number of fault-connected identifiers related to said estimated causes.

Said parameter is preferred to the sum of expected values indicating how often each said estimated cause is estimated to be the cause of defectiveness, or the sum of probabilities of the past causes of defectiveness, said sum being obtained for each said fault-connected identifier.

The electric parts testing system is preferred to further comprise a display unit to display at least one or more of the estimated causes having the largest or smallest parameter value.

The electric parts testing system is preferred to further comprise a display unit to display a matrix of said estimated causes and said fault-connected identifiers to show which of the estimated causes is related to which of the fault-connected identifiers.

Each estimated cause is preferred to be related to expected data obtained by estimation of the nature of the electric part or the test condition, or data on actual results estimated on the basis of the actual past causes of defectiveness, said data on actual results being automatically renewed upon every calculation by the arithmetical unit.

An electric parts testing system includes a server system and a client system capable of exchanging data by mutual communication, comprising:

a testing unit contained in the client system, said testing unit testing electric parts for individual condition identifiers assigned for identification of a plurality of test conditions different from each other;

a first memory unit contained in the server system, said first memory unit previously storing estimated causes in relation at least to each said condition identifier, said estimated causes being obtained by estimation as causes of defectiveness of the electric parts;

a second memory unit contained in the client system, said second memory unit storing at least one or more of the condition identifiers regarded as fault-connected identifiers when any of the electric parts are judged to be defective;

an arithmetical unit contained in the server system, said arithmetical unit calculating a parameter when there are a plurality of said fault-connected identifiers, said parameter being related to the fault-connected identifiers at least for each said estimated cause related to the fault-connected identifiers; and a display unit contained in the client system, said display unit displaying at least the parameter for each said estimated cause, wherein the server system receives the fault-connected identifiers transmitted from the client system and transmits to the client system said parameter and said estimated causes related to the fault-connected identifiers.

The display unit is preferred to display a result display region for displaying result information of the tests having a plurality of said fault-connected identifiers, and the display unit displays a transmission command region for transmitting the result information displayed on the result display region to the server system in response to an operation of the client system, and after transmission of the result information to the server system, the display unit displays at least the parameter sent from the server system and the estimated causes related to the fault-connected identifiers.

The client system is preferred to transmit a transmitter identifier together with the result information in response to an operation of the client system, said transmitter identifier identifying the client system supplied with the result information from the server system.

The operation of the client system is preferred to be a selection of the transmission command display through an input device that can communicate with the client system.

An electric parts testing method to test electric parts for individual condition identifiers assigned for identification of a plurality of test conditions different from each other, comprises:

a first storage step of previously storing estimated causes in a memory, said estimated causes being obtained by estimation as causes of defectiveness of the electric parts and being related at least to each said condition identifiers;

a second storage step of storing in memory at least one or more of the condition identifiers regarded as fault-connected identifiers when any of the electric parts are judged to be defective;

an arithmetical step of calculating a parameter related to the fault-connected identifiers, said parameter being calculated at least for each said estimated cause related to the fault-connected identifiers when there are a plurality of said fault-connected identifiers.

The parameter calculated in the arithmetical step is preferred to be the sum of expected values indicating how often each said estimated cause is estimated to be the cause of defectiveness, or the sum of probabilities of the past causes of defectiveness, said sum being obtained for each said fault-connected identifier.

The electric parts testing method is preferred to further comprise a display step of displaying at least one or more of the estimated causes having the largest or smallest parameter value.

The estimated cause is preferred to be related to expected data obtained by estimation from the nature of the electric part and the test condition, said estimated cause being replaced by data on actual results estimated from the actual past causes of defectiveness.

The arithmetical step is preferred to includes:

a first arithmetic step of calculating a first parameter for each estimated cause, said first parameter being related to a plurality of the fault-connected identifiers; and a second arithmetical step of calculating a second parameter for each estimated causes, said second parameter being related to a plurality of the fault-defective identifiers excluding predetermined one or more of the fault-connected identifiers.

The electric parts testing method is preferred to be executed on a server system and a client system which are prepared to exchange data by mutual communication, wherein the server system executes the first storage step, wherein the client system executes the second storage step, wherein the client system executes a transmission step for transmitting a plurality of the fault-connected identifiers to the server system, wherein the server system executes a receiving step for receiving the plurality of the fault-connected identifiers transmitted from the client system, wherein the server system executes the arithmetical step, and wherein the server system executes a return step for sending at least the parameter together with the estimated causes back to the client system, said estimated causes being related to the fault-connected identifiers.

Before the transmission step, the client system is preferred to execute a first display step of displaying at least a result display region for displaying a plurality of the fault-connected identifiers, and a transmission command region for transmitting the plurality of the fault-connected identifiers together with a transmitter identifier assigned to specify the client system, wherein, in the transmission step, the client system is preferred to transmit data, which data are displayed in the result display region, to the server system in response to an operation of the client system, and wherein, after the return step, the client system is preferred to execute a second display step for displaying the parameter sent back from the server system for individual estimated causes.

According to the invention, after defectiveness is found by a test of electric parts, an electric part more likely to be defective than a conventional one can be brought to user's attention.

Additionally, the invention can show the user an electric part with higher probability of being defective than conventional one from the initial use of the electric parts testing system.

Furthermore, according to the invention, after a fault is found by a test of electric parts, a truly defective electric part can be identified more quickly than with the conventional technique.

BRIEF DESCRIPTION OF DRAWINGS

FIG. 4 is a schematic diagram showing every three fault-estimated board regions stored in the memory unit 142 for each test number.

FIG. 6 is a schematic view showing a matrix of fault-estimated board regions and Fail test numbers.

FIG. 7 is a schematic diagram showing a table exhibiting fault-estimated board regions in the order from the largest value to the smallest of Parameter 1 or Parameter 2.

FIG. 9 is a schematic view showing a second matrix and Parameter 3 and Parameter 4.

FIG. 10 is a diagram in form of a table showing Parameter 5 and Parameter 6.

BEST MODE FOR CARRYING OUT THE INVENTION

An embodiment of the invention will now be explained below with reference to the drawings. The embodiment should not be construed to limit the invention.

Figure 1:
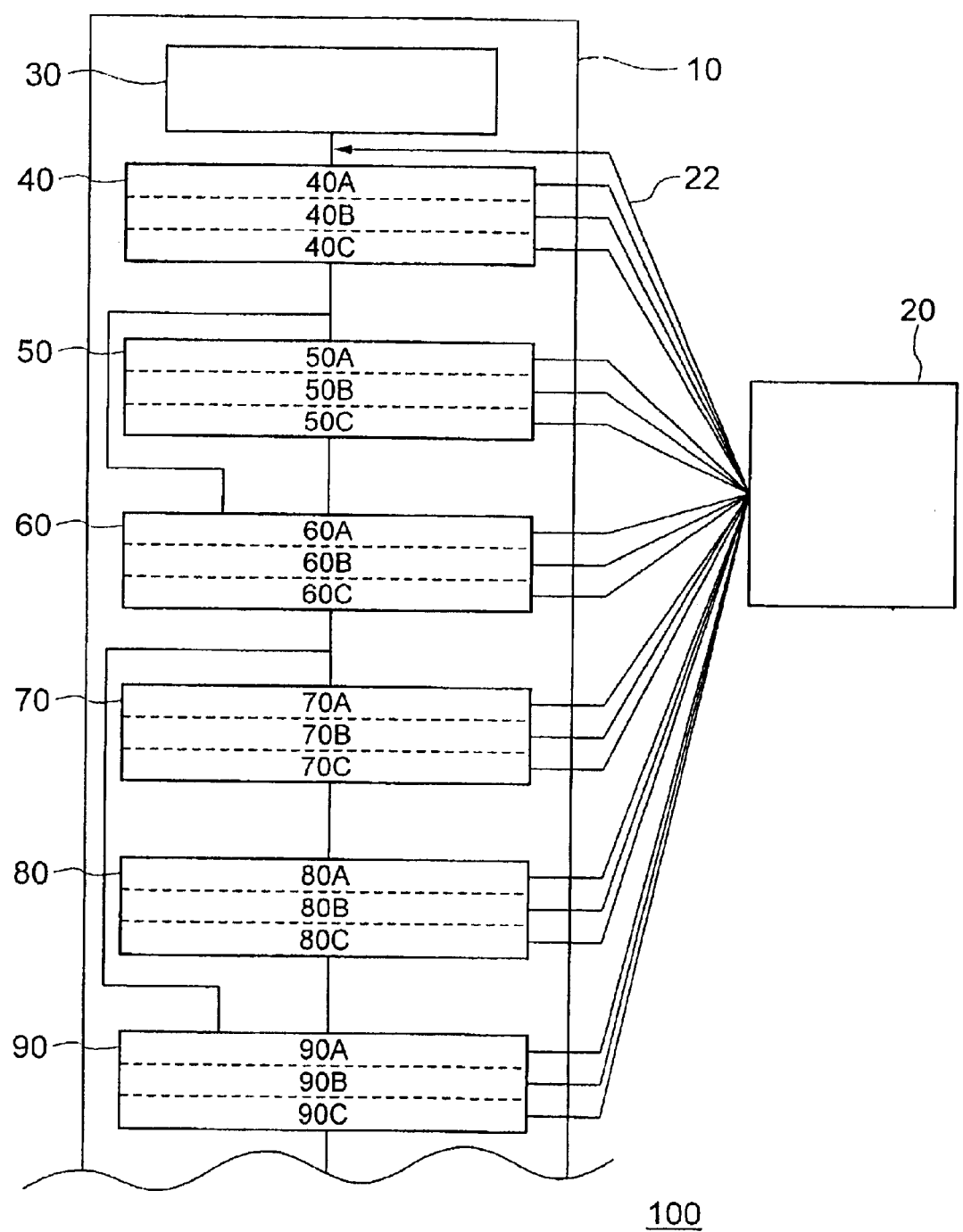
FIG. 1 is a schematic diagram of an electric parts testing system according to an embodiment of the invention.

FIG. 1 is a schematic diagram showing a semiconductor testing system 100 according to an embodiment of the invention. In this embodiment, the semiconductor testing system 100 includes a DUT testing unit 10 for testing and evaluating DUT (not shown). The DUT testing unit 10 includes boards 40, 50, 60, 70, 80 and 90 (hereinafter called boards 40 etc.) to be used for testing DUTs under various test conditions. The DUT testing unit 10 further includes a board control unit 30 for controlling the boards 40 etc. The boards 40 etc. may be a DUT board, socket board, test board, load board, performance board, fixture board, motherboard, etc.

The semiconductor testing system 100 further includes a self-diagnostic unit 20 for testing the boards 40 etc.

In the embodiment, the number of boards 40 etc. is not limited. Additionally, although the self-diagnostic unit 20 tests the boards 40 etc., it may be configured to test other parts in the semiconductor testing system 100 as well, such as those inside the testing head and/or those around the probe card, for example. Here is taken the semiconductor testing system 100 as an example of the electric parts testing system according to the embodiment. However, the electric parts testing system may be another type of testing system for testing functions of household electric appliances, for example.

The board control unit 30 controls the board 40 etc. to output a DUT test signal of certain frequency from the semiconductor testing system 100 to DUT at a certain timing. The boards 40 etc. introduce the signal from the board 40 and, after changing the signal via the board 50, 60, 70 or 80, they output the DUT test signal through the board 90. In response to the electric signal from the boards 40 etc., DUT sends an output signal back to the semiconductor testing system 100. The semiconductor testing system 100 evaluates the output signal from DUT and judges its quality.

To ensure accurate judgment of the DUT quality, it is essential that the boards 40 etc. function normally.

Thus, for the purpose of testing whether the boards 40 etc. work normally, the semiconductor testing system 100 includes the self-diagnostic unit 20. That is, in this embodiment, the boards 40 etc. and/or other electric parts are disposed inside the semiconductor testing system, and the semiconductor testing system examines the electric parts.

The self-diagnostic unit 20 transmits a board test signal (see the arrow mark 22) to the board 40 nearest to the input end according to a predetermined test condition. The test condition prescribes requirements on the current, voltage, frequency, timing and destination of the board test signal, and site for outputting a measurement result. Various versions of those requirements are prepared as a plurality of different test conditions. Test numbers are assigned to these different test conditions to distinguish them from each other. The self-diagnostic unit 20 judges whether the boards 40 etc. are good (hereinafter expressed as Pass) or bad (hereinafter expressed as Fail) for individual test numbers. The self-diagnostic unit 20 examines the boards in succession from the board 40 nearest to the input end toward the board 90 nearest to the output end in accordance with the test numbers.

Further, the self-diagnostic unit 20 examines individual parts of each boards 40 etc. In the instant embodiment, the self-diagnostic unit 20 divides each of the boards 40 etc. into three regions for testing. More specifically, the self-diagnostic unit 20 divides the board 40 into board regions 40A, 40B and 40C, the board 50 into board regions 50A, 50B and 50C, the board 60 into board regions 60A, 60B and 60C, the board 70 into board regions 70A, 70B and 70C, the board 80 into board regions 80A, 80B and 80C, and the board 90 into board regions 90A, 90B and 90C (hereinbelow, these board regions are called board regions 40A etc.), and receives results of measurement from the respective board regions.

The measurement result of one board region is affected by results from other board regions as well. For example, once the board test signal is transmitted to the board 40, it passes through the board regions 40A, 40B, 40C and the board region 50A of the next board. Therefore, a measurement result from the board region 50B is affected not only by the board region 50B but also by the board regions 40A, 40B, 40C and 50A.

Additionally, the boards 40 etc. are connected not only sequentially from the board 40 to the board 90, but they may also be connected at random order. Therefore, the board test signal input from the board 40 does not always pass the other boards successively up to the board 90.

In the instant embodiment, the output signal from the board 40 enters not only into the board 50 but also into the board 60. The output signal from the board 60 enters not only into the board 70 but also into the board 90.

Therefore, even when the measurement result of a certain board region is Fail, another board region may be the cause of the defectiveness. Further, defectiveness of a certain board region often invites evaluation of Fail as the measurement result in a plurality of test numbers. Therefore, it is difficult for the user to locate the actual defective board from the test number and the measurement result when a test produces a Fail.

Figure 2:
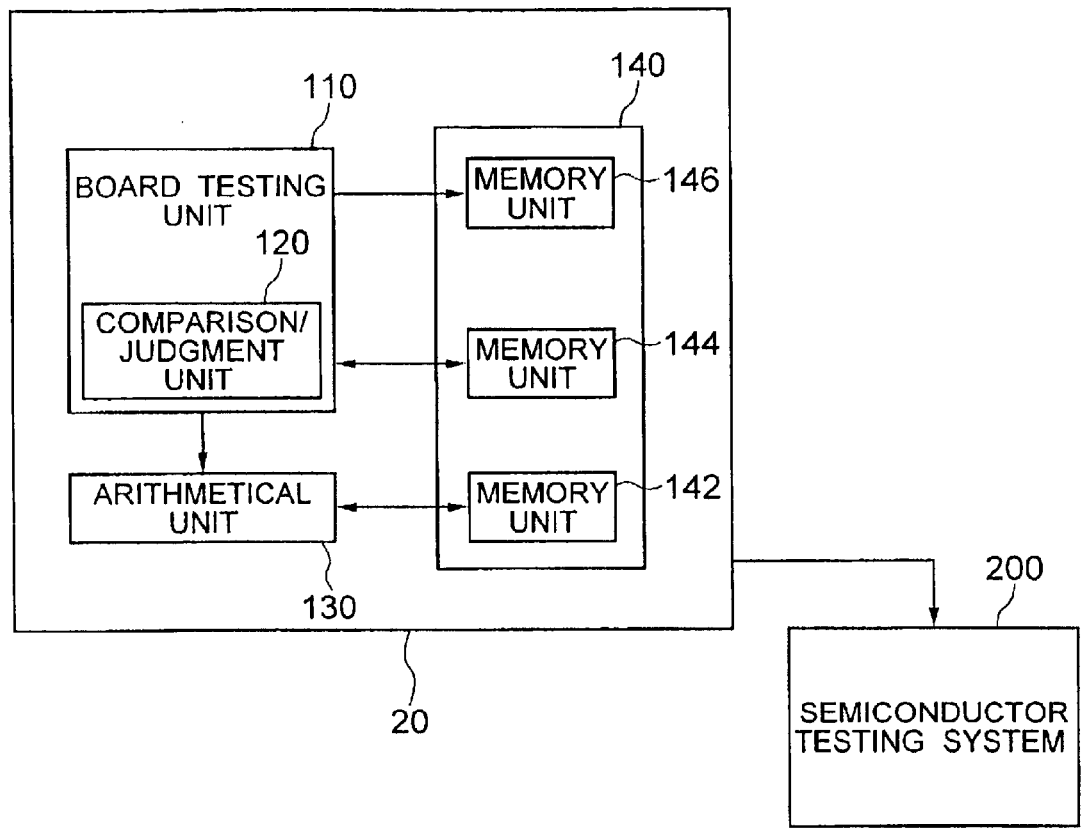
FIG. 2 is a schematic diagram showing in greater detail a self-diagnostic unit 20 shown in FIG. 1.
Figure 3:
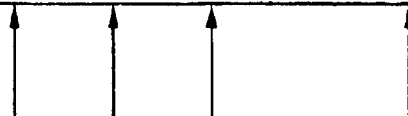
FIG. 3 is a schematic diagram showing test conditions, result conditions, results of measurement and judgment results, which are stored in the memory unit 146, for individual test numbers.

FIG. 2 is a schematic diagram showing greater detail of the self-diagnostic unit 20 of FIG. 1. The self-diagnostic unit 20 includes: a board testing unit 110 for testing the boards 40 etc. for each test number (see FIG. 3) assigned to each different test conditions to distinguish it from others; a memory unit 142 that stores as fault-estimated board regions one or more of the board regions 40A etc. expected to be causes of defectiveness (see FIG. 4) in relation at least to individual test numbers; a memory unit 144 that stores at least fault-connected test numbers, which are any test numbers for any of the boards 40 etc. found to be defective (as shown in FIG. 3 and hereinafter called Fail test numbers); and an arithmetical unit 130 to compute a parameter related to a plurality of Fail test numbers for individual fault-estimated board regions in the event there are a plurality of Fail test numbers.

The board test portion 110 includes a comparison/judgment unit 120 that compares a measurement result of the boards 40 etc. with a result condition the measurement should satisfy, and thereby judges whether the measurement result is Pass or Fail. The self-diagnostic unit 20 further includes a memory unit 146 for storing result conditions, measurement results and judgment results.

The memory units 142, 144, 146 may be either discrete memory devices or different memory regions of a single memory device. The components shown inside the self-diagnostic unit 20 in FIG. 2 may be incorporated in the self-diagnostic unit 20 when the self-diagnostic unit 20 is a separate device. Alternatively, these components contained in the self-diagnostic unit 20 may be independent devices, respectively. Especially, a memory device of a host computer (not shown) provided in the semiconductor testing system 100 is typically used as the memory units 142, 144, 146.

The semiconductor testing system 100 further includes a monitor 200 capable of outputting at least parameters and Fail test numbers from the self-diagnostic unit 20. The monitor 200 may be the monitor of the computer located outside the semiconductor testing system 100. Alternatively, the monitor 200 may be provided inside the self-diagnostic unit 20.

FIG. 3 is a schematic diagram showing test conditions, result conditions, measurement results and judgment results stored in the memory unit 146 for individual test numbers. Test numbers are assigned to individual test conditions and result conditions.

In the instant embodiment, there are test numbers Test 1 to Test 7. Judgment results in Tests 1, 2, 3, 4, 5, 6 and 7 represent Pass when the measurement result complies with the result condition in each test number, and represent Fail when the measurement result does not comply with the result condition. For example, when a measurement result falls within a specification, a corresponding judgment result is shown as Pass, and when a measurement result is out of the specification, the judgment result is shown as Fail.

In the instant embodiment, the judgment result is Fail in Test 3, 4, 5 and 7 indicated by arrows in FIG. 3.

Test conditions may be more or less than 7. Test numbers increase or decrease in accordance with the number of test conditions.

FIG. 4 is a schematic diagram showing every three fault-estimated regions stored in the memory unit 142 for each test number. The fault-estimated regions are obtained by estimating boards that are highly likely to be causes of defectiveness when the judgment result is Fail. The fault-estimated board regions are related to test numbers, respectively. The fault-estimated board regions are stored in the memory unit 142 for individual test numbers.

Expected data estimated from test conditions and internal structures of the boards may be assigned to the fault-estimated board regions. For example, it can be confirmed from the test condition which board regions the board test signal passed through. Further, the number of semiconductor devices packaged on a specific board, the number of gates of transistors on the board, length of wiring on the board, and so on, can be confirmed by looking into the inner structure of the board. Thereby, fault-estimated board regions can be estimated to a certain level. The higher the possibility that fault-estimated board regions become causes of defectiveness, the higher the expected values.

In the instant embodiment, estimated values are related not only to individual test numbers but also to the fault-estimated board regions. In addition, expected values are stored in the memory unit 142 in combination with fault-estimated board regions for individual test numbers.

In FIG. 4, expected values are shown as numerical values in parentheses. Fault-estimated regions are shown as fault-estimated board regions 1, fault-estimated board regions 2 and fault-estimated board regions 3 in the order of higher to lower expected values.

In the instant embodiment, measurement results in Test 1, 2, 3, 4, 5, 6 and 7 are those that are output from the boards 40C, 50C, 60C, 70C, 80C, 90B and 90C, respectively.

Therefore, it is appreciated that the fault-estimated board regions gradually change from board regions of the board 40 to board regions of the board 90 as the test number progresses from Test 1 to Test 7.

If expected data are used for fault-estimated board regions, then the self-diagnostic unit 20 can test the boards 40 etc. from the initial use of the semiconductor testing system 100, and the user need not wait until data on the past faults are accumulated.

On the other hand, the fault-expected board regions may be data on actual results that were estimated on the basis of board regions that had actually been causes of defectiveness in the past tests by the self-diagnostic unit 20.

For example, assume that judgment by Test 1 resulted in Fail one hundred times in the past. In the case that 50 of these faults occurred in the board region 40C; 30 of the faults in the board region 40A; and 20 of the faults in the board region 40B, the probability of faults of the board region 40C is 50%, the probability of faults of the board region 40A is 30%, and the probability of faults of the board region 40B is 20%.

Probabilities of the past faults are related, together with the fault-estimated board regions, to individual test numbers, and probabilities of the past faults are stored, together with the fault-estimated board regions, in the memory unit 142 for individual test numbers.

In FIG. 4, probabilities of the past faults are shown in numerical values in parentheses in this case. Fault-estimated board regions are shown in the order from fault-estimated board regions 1 with the highest probability of fault, to the fault-estimated board regions 3 with the lowest probability.

Test numbers and fault-estimated board regions may be related by common file numbers assigned thereto as electric signals, or alternatively, they may be related by any appropriate electric, magnetic or optical method. These test numbers and fault-estimated board regions may be related only when expected values or probabilities of the past faults reach predetermined values.

When data on actual results in fault-estimated board regions are used, conditions or structures, for example, not taken into consideration for expected data, can be added as additional factors to estimate fault-estimated board regions.

The user may use expected values from the initial use of the semiconductor testing system 100 until data on actual results are accumulated, and may use the data on actual results after they are accumulated. The time for switching from expected values to data on actual results may be any point of time where a desired amount of data on actual results is accumulated. It is also acceptable to switch all expected values to data on actual results after a predetermined time from the initial use of the semiconductor testing system 100.

Data on actual results may be automatically renewed every time the arithmetical unit 130 executes a calculation. Thereby, fault-estimated board regions can be estimated by the most recent, reliable data on actual results.

In the instant embodiment, Test 3, Test 4, Test 5 and Test 7 having answered Fail as judgment results are shown by arrows also in FIG. 4.

Figure 5:
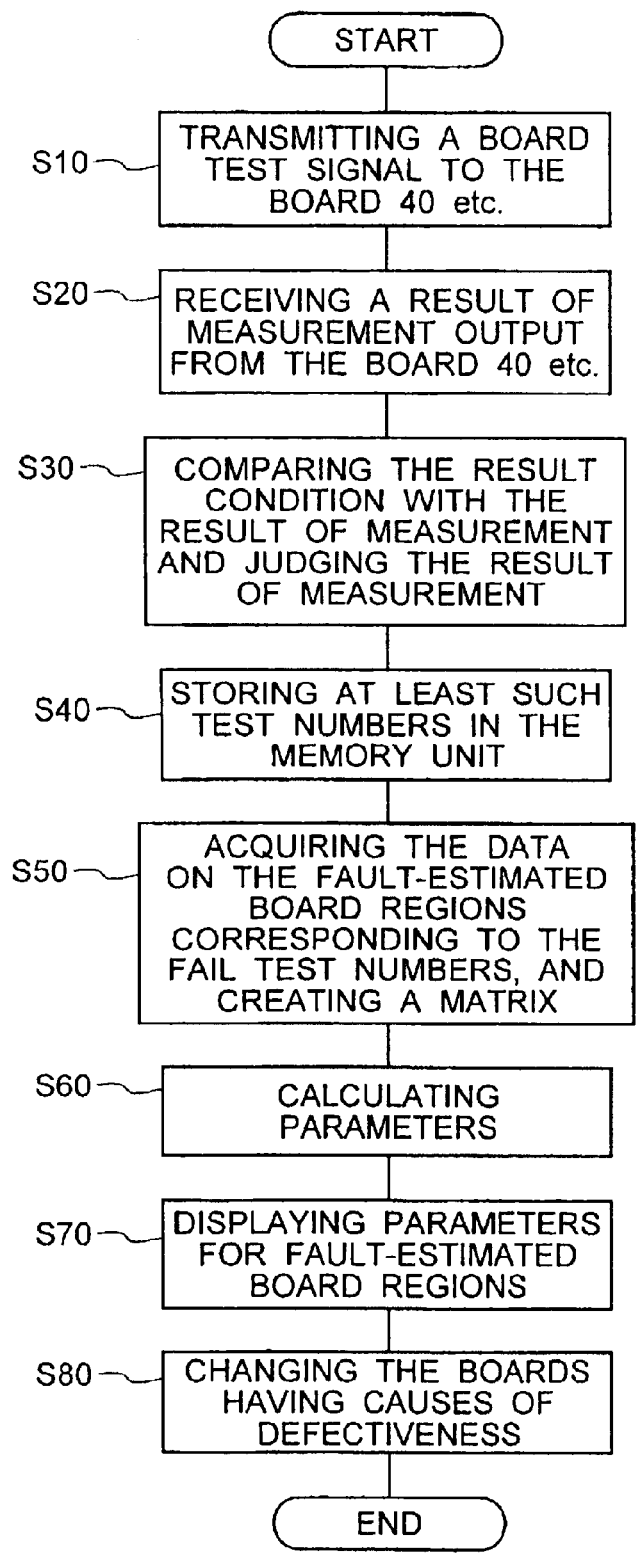
FIG. 5 is a flow chart of a process for the self-diagnostic unit 20 to examine a board 40, etc. in the semiconductor testing system 100.

FIG. 5 is a flowchart showing a process for the self-diagnostic unit 20 to test the boards 40 etc. in the semiconductor testing system 100. Upon testing the boards 40 etc., the self-diagnostic unit 20 uses test conditions and results conditions stored in the memory unit 146 and data on fault-estimated board regions stored in the memory unit 142.

The process for testing the boards 40 etc. is explained below with reference to FIGS. 2 and 5. When a test of the boards 40 etc. is started, the board testing unit 110 acquires a test condition from the memory unit 146, and transmits a board test signal according to the test condition to the board 40 etc. (S10).

The board testing unit 110 receives a measurement result output from the boards 40 etc. in response to the board test signal (S20).

The board testing unit 110 acquires a result condition from the memory unit 146, and the comparison/judgment unit 120 compares the result condition with the measurement result. If the result condition and the measurement result do not match, the comparison/judgment unit 120 judges the measurement result to be Fail. In contrast, if the result condition and the measurement result do match, the comparison/judgment unit 120 judges the measurement result to be Pass (S30).

At least such test numbers having answered Fail as judgment results, namely the Fail test numbers, are stored in the memory unit 144 (S40). Alternatively, all judgment results and corresponding test numbers may be stored in the memory unit 144 for individual test numbers. Further, test conditions, result conditions or measurement results may be stored in the memory unit 144 for individual test numbers.

Subsequently, the arithmetical unit 130 acquires from the memory unit 142 the data on the fault-estimated board regions corresponding to the Fail test numbers (see FIG. 3) stored in the memory unit 144, and creates a matrix (see FIG. 6) (step S50). This matrix is a conceptive matrix expressing the relation between Fail test numbers and fault-estimated board regions. Therefore, the matrix may be any data that can be recognized electrically or magnetically.

In the next step, the arithmetical unit 130 calculates parameters related to Fail test numbers based on the matrix for individual fault-estimated board regions (S60).

Further, the monitor 200 displays parameters at least for fault-estimated board regions (S70). According to the fault-estimated boards and parameters displayed, the user may replace boards having causes of defectiveness (S80).

The step for the arithmetical unit 130 to calculate parameters for individual fault-estimated board regions is explained below in greater detail.

FIGS. 6, 7, 9 and 10 are schematic diagrams showing calculations executed by the arithmetical unit 130 and parameters obtained by the calculations.

FIG. 6 conceptually shows some of fault-estimated board regions extracted from FIG. 4 as being related to Fail test numbers in form of a matrix of fault-estimated board regions and Fail test numbers. Fault-estimated board regions related to Test 3 and fault-estimated board regions not related to Test 3 are partitioned by the broken line. The fault-estimated board regions related to Test 3 are shown in the order from the highest to the lowest in expected value or probability of the past faults. Therefore, this matrix is arranged in favor of Test 3.

In FIG. 6, the sign "*" represents that, in each cell with this sign, the Fail test number and the fault-estimated board region are related to each other. The numerical value in parentheses after the sign "*" indicates probability of the past faults or expected value. The sign "/" represents that, in each combination with this sign, the Fail test number and the fault-estimated board region are not related.

Parameter 1 indicates the number of Fail test numbers related to each fault-estimated board region, i.e. the number of "*" of each region. For example, the value of Parameter 1 of the fault-expected board region 50B is 2. The value of Parameter 1 of the fault-estimated board region 60C is 4. The arithmetical unit 130 calculates each value of Parameter 1 by counting the number of Fail test numbers related to each fault-estimated board region, that is, the number of the sign "*".

Parameter 2 is the value obtained by the addition of expected values of each fault-estimated board region to be causes of defectiveness, or probabilities of the region to have actually contained defectiveness in the past. That is, Parameter 2 is the sum of numerical values in parentheses of each fault-estimated board region. For example, the value of Parameter 2 of the fault-estimated board region 50B is 80, and value of Parameter 2 of the fault-estimated board region 60C is 120. The arithmetical unit 130 calculates expected values or probabilities of the past faults for individual fault-estimated board regions.

FIG. 7 is a schematic diagram showing fault-estimated board regions from the highest to the lowest in value for Parameter 1 or Parameter 2 in form of a table. In FIG. 7, the fault-estimated region with the highest value in Parameter 1 or Parameter 2 is labeled with Bad, and the other fault-estimated board regions are labeled with Doubtful.

It is appreciated from FIG. 7 that the fault-estimated board region 60C is, with a high degree of probability, the cause of defectiveness. Therefore, the user may change the board region 60C or the board 60.

The conventional method selects a Fail test number in FIG. 6, and determines from among all the related fault-estimated board regions, that the cause of defectiveness is the fault-estimated board region with the highest probability of past faults. For example, in regard to Test 3, the fault-estimated board region 50B having the highest probability of the past faults is simply regarded to be the cause of defectiveness.

However, according to the instant embodiment, as shown in FIGS. 6 and 7, substantially accurate judgment of the cause of defectiveness is made possible by calculation by the arithmetical unit 130 on the basis of a plurality of Fail test numbers.

Although the instant embodiment shows both Parameter 1 and Parameter 2, only one of these parameters may be used. Another parameter other than Parameter 1 and Parameter 2 may be used as well.

Additionally, any number of fault-estimated board regions having values of Parameter 1 or Parameter 2 higher than a predetermined value may be regarded as Bad while the others of the fault-estimated board regions are regarded as Doubtful.

The arithmetical unit 130 maybe configured to calculate parameters only for fault-estimated board regions related to one Fail test number. For example, in FIG. 6, the arithmetical unit 130 may calculate parameters only for fault-estimated board regions 50B, 60C and 60B without calculating parameters for fault-estimated board regions 70C, 80A and 90B. Thereby, the arithmetical unit 130 can calculate parameters more quickly.

The arithmetical unit 130 may exclude fault-estimated board regions not defective apparently before calculating parameters. Assume, for example, that if the judgment result by Test 6 is Pass, the board region 80A is apparently non-defective (see FIG. 4). In this case, the arithmetical unit 130 excludes the board region 80A from the fault-estimated board regions beforehand, and thereafter calculates parameters. Thereby, the user can determine the cause of defectiveness more accurately.

Next explained is an embodiment in which the arithmetical unit 130 repeats calculation of parameters two or more times. This embodiment is the same as the foregoing embodiment up to completion of the first calculation. Therefore, explanation is made below from the step after completion of the first calculation by the arithmetical unit 130.

Figure 8:
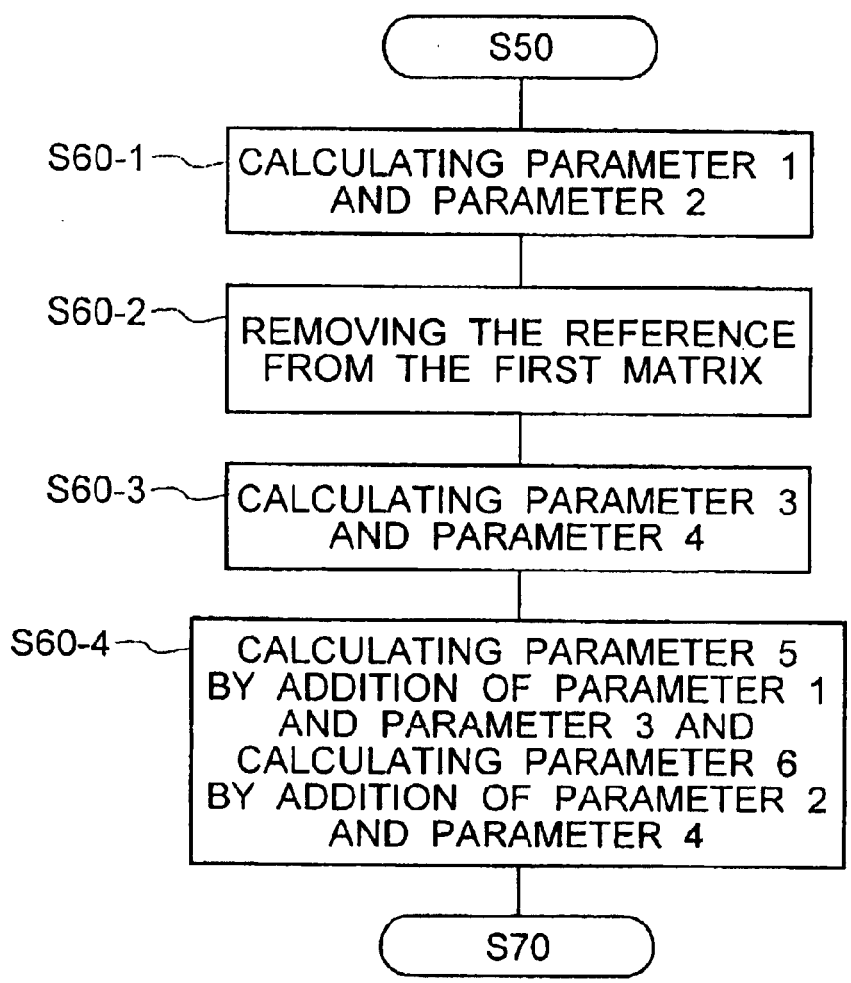
FIG. 8 is a flow chart of a method according to an embodiment configured to calculate parameters several times.

FIG. 8 is a flowchart showing this embodiment for calculating parameters a plurality of times. The process from S10 to S50, which is identical to S10 to S50 shown in FIG. 5, is omitted from explanation made below.

After execution of the step S50, the arithmetical unit 130 calculates Parameter 1 and Parameter 2 in the same manner as S60 of FIG. 5. That is, the arithmetical unit 130 carries out the first calculation (S60-1).

Subsequently, the Fail test number used as the reference is removed from the first matrix used for calculation of Parameter 1 and Parameter 2 in S60-1 (S60-2).

In this embodiment, the Fail test number used as the reference is Test 3. Thus a second matrix excluding Test 3 is created (see FIG. 9).

After that, according to the second matrix, the arithmetical unit 130 calculates Parameter 3 and Parameter 4 in the same manner as that of S60 of FIG. 5. That is, the arithmetical unit 130 carries out the second calculation (S60-3). In this embodiment, the second matrix having removed Test 3 is made in favor of Test 4.

In this embodiment, four parameters, namely Parameter 1, Parameter 2, Parameter 3 and Parameter 4, are obtained. Therefore, the method shown here can present the user with more parameters than the method in which the arithmetical unit 130 calculates only once. Therefore, this method enables the user to locate a board having the cause of defectiveness more accurately.

The arithmetical unit 130 may execute operation of Parameter 1, Parameter 2, Parameter 3 and Parameter 4 (S60-4).

For example, in this embodiment, the arithmetical unit 130 calculates Parameter 5 by adding Parameter 1 to Parameter 3, and calculates Parameter 6 by adding Parameter 2 to Parameter 4 (see FIG. 10).

Steps S70 et seq. are identical to the embodiment show in FIG. 5.

FIG. 9 is a schematic view showing the second matrix and Parameters 3 and 4. The second matrix is created based on Test 4, excluding Test 3 from the first matrix.

FIG. 10 is a diagram in form of a table showing Parameter 5 and Parameter 6. This table shows fault-estimated board regions from those having the largest values, namely Parameter 5 and Parameter 6. Parameter 5 is the sum of Parameter 1 and Parameter 3. Parameter 6 is the sum of Parameter 2 and Parameter 4. Since Parameter 5 and Parameter 6 show numerical values of respective fault-estimated board regions with larger differences between them, the user can determine the cause of defectiveness more easily.

Figure 11:
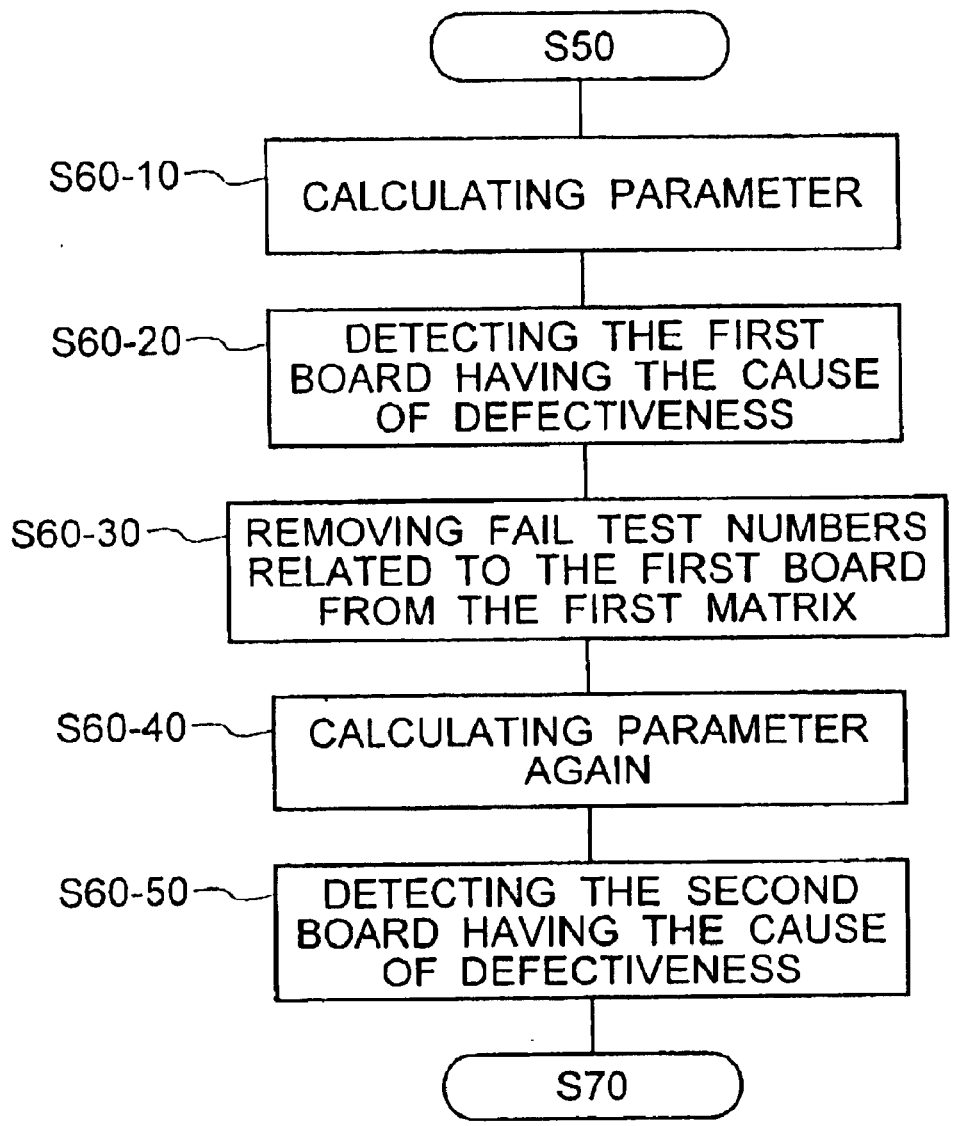
FIG. 11 is a flowchart showing the process of detecting a plurality of boards having causes of defectiveness by multiple times of calculation by the arithmetical unit 130.

FIG. 11 is a flowchart showing the process of detecting a plurality of boards having causes of defectiveness by multiple calculations by the arithmetical unit 130.

The process from S10 to S50 is identical to the process from S10 to S50 shown in FIG. 5, and therefore is omitted from explanation made below. After execution of S50, the arithmetical unit 130 calculates Parameter 1 for the first matrix or Parameter 2 for the first matrix in the same manner as S60 of FIG. 5. That is, the arithmetical unit 130 carries out the first calculation by using the first matrix (S60-10).

Subsequently, the self-diagnostic unit 20 detects the first board having a cause of defectiveness by using Parameter 1 for the first matrix or Parameter 2 for the first matrix (S60-20).

After that, the second matrix is created by removing Fail test numbers related to the first board from the first matrix (S60-30).

Then the arithmetical unit 130 calculates Parameter 1 for the second matrix or Parameter 2 for the second matrix in the same process as S60 of FIG. 5 (S60-40).

Thereafter, the self-diagnostic unit 20 detects the second board having a cause of defectiveness by using Parameter 1 for the second matrix or Parameter 2 for the second matrix (S60-50). As shown in FIG. 4, test numbers and fault-estimated board regions are related to a certain extent. Therefore, by excluding Fail test numbers related to the first board from the first matrix, it is possible to create the second matrix less affected by defectiveness of the first board. Thus by using the second matrix, the self-diagnostic unit 20 can detect the second board substantially freely from influences of the first board.

In the above-explained embodiment, the self-diagnostic unit 20 detects the board regions 40A etc. having causes of defectiveness. However, it may detect the boards 40 etc. that are units for replacement. In this case, the memory unit 142 may store data on fault-estimated boards 40 etc. instead of data on fault-estimated board regions 40A etc.

The monitor 200 may display fault-estimated board regions or fault-estimated boards from the largest to the smallest parameter values. For example, the monitor 200 may display a table, matrix or table of FIG. 6, 7, 9 or 10.

Alternatively, the monitor 200 may display only one of fault-estimated board regions or fault-estimated boards having the largest parameter value. For example, the monitor 200 may display only the fault-estimated board region indicated as Bad in FIG. 7 or 10. Thereby, the user can be informed of the defective board with relatively high probability earlier.

Figure 12:
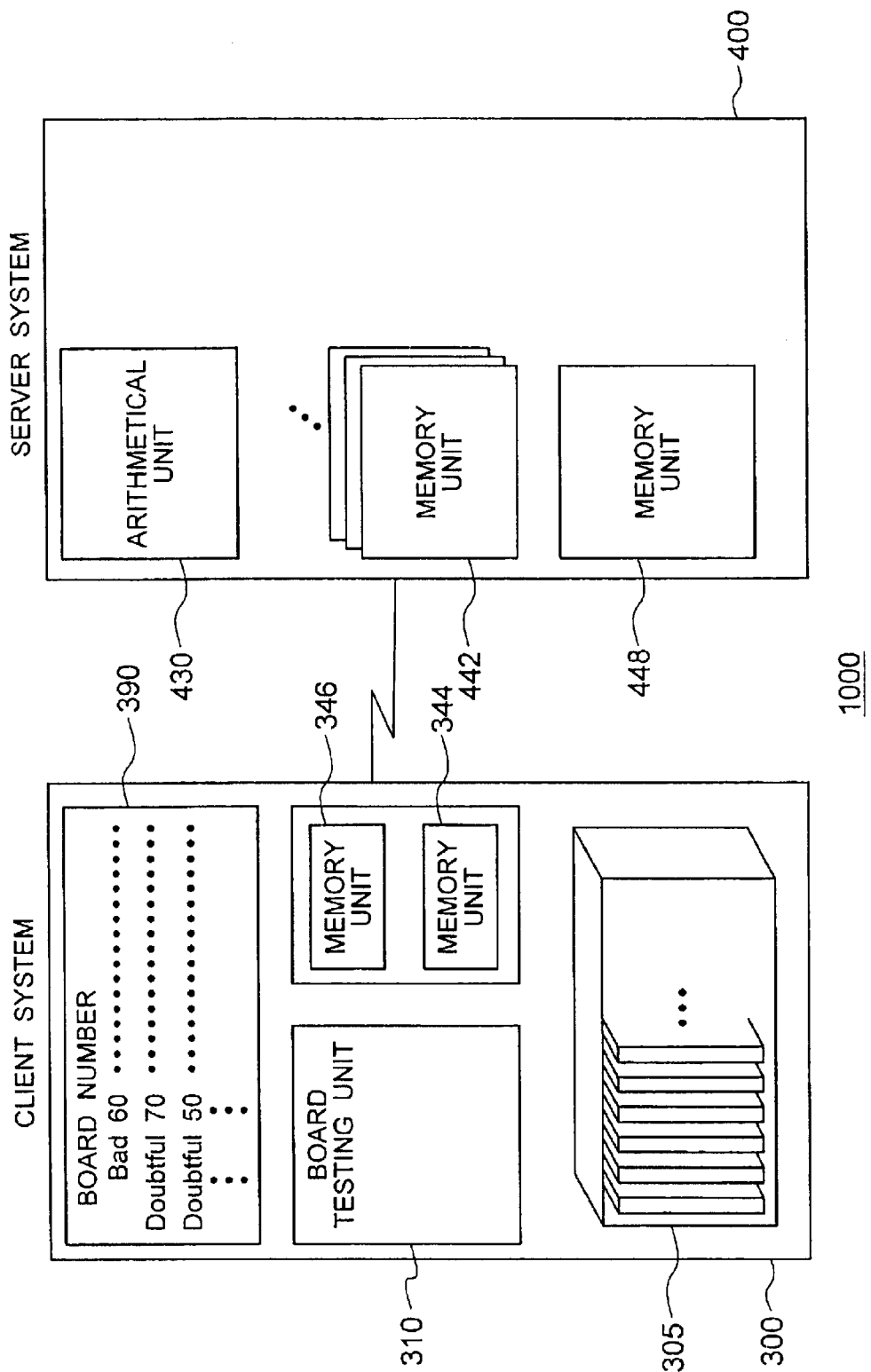
FIG. 12 is a schematic diagram of an electric parts testing system according to the instant embodiment of the invention.

FIG. 12 is a schematic diagram of an electric parts testing system according to the instant embodiment of the invention. Here is explained a semiconductor testing system 1000 as an example of electric parts testing systems according to this embodiment. The semiconductor testing system 1000 includes a client system 300 and a server system 400 that can communicate with each other. Communication between the client system 300 and the server system 400 may be either wireless or wired.

The client system 300 includes a DUT testing unit 305, board testing unit 310, memory unit 344, memory unit 356 and monitor 390.

The DUT testing unit 305 corresponds to the DUT testing unit 10 shown in FIG. 1, and includes a number of boards. The board testing unit 310 corresponds to the board testing unit 110 shown in FIG. 2. The memory units 344 and 346 correspond to the memory units 144 and 146, respectively. Thus the memory unit 344 stores fault-connected test numbers, and the memory unit 346 stores result conditions, measurement results and judgment results. The monitor 390 corresponds to the monitor 200.

The server system 400 includes an arithmetical unit 430, memory unit 442 and memory unit 448.

The arithmetical unit 430 corresponds to the arithmetical unit 130 shown in FIG. 2. The memory unit 442 corresponds to the memory unit 142 of FIG. 2. Thus the memory unit 442 stores data on fault-estimated board regions. In some applications, the system includes a plurality of client systems 300, or each client system 300 includes a plurality of DUT testing units 305 different from each other. In these cases, the memory unit 442 stores files of different fault-estimated board regions for individual client systems or individual DUT testing units. In order to enable selection of adequate fault-estimated board regions, the memory unit 448 stores data on model numbers for distinguishing individual client systems or DUT testing units.

Next explained is the operation of the board testing system 1000.

Figure 13:
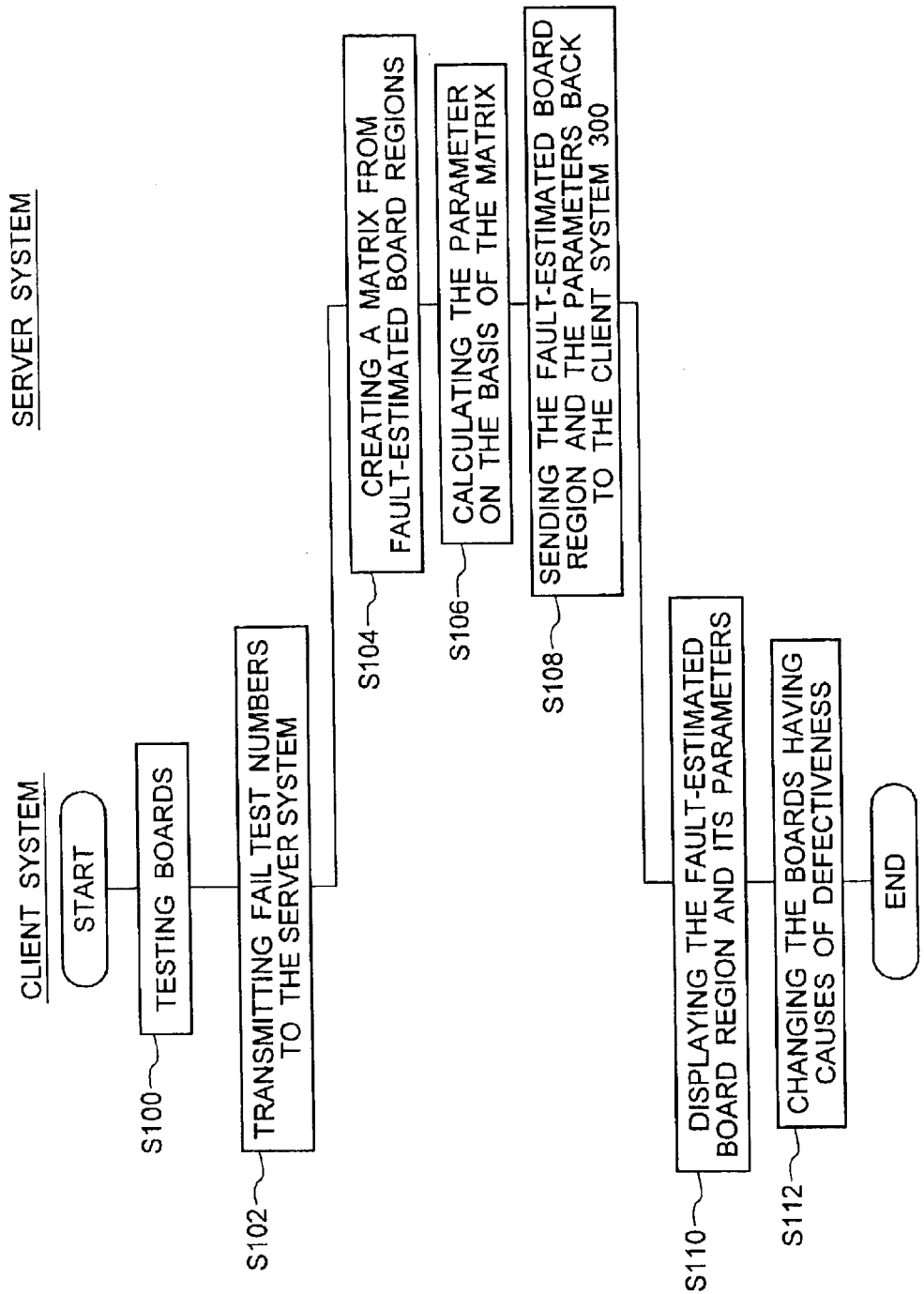
FIG. 13 is a flowchart showing a board testing process by the semiconductor testing system 1000.

FIG. 13 is a flowchart showing a board testing process by the semiconductor testing system 1000. Note here that FIG. 13 shows the operation of the client system 300 and the operation of the server system 400 in the left and right columns, respectively.

First, in the client system 300, the board testing unit 310 examines boards in the DUT testing unit 305 (S100).

After that, the client system 300 transmits at least Fail test numbers to the server system 400 from among test conditions, measurement results or test numbers (S102). Simultaneously, the client system 300 additionally transmits a transmitter identifier enabling identification of the client system, such as an address described by URL (uniform resource locators). Furthermore, the client system transmits information about the model number, etc. of the DUT testing unit 305.

In the next step, the arithmetical unit 430 in the server system 400 creates a matrix similarly to FIG. 6 on the basis of the Fail test number from the client system 300 (S104). In this process, a file of the appropriate fault-estimated board region is selected in accordance with the information about the client system 300 such as the transmitter identifier, DUT testing unit 305, or the like. Based on the file of the appropriate fault-estimated board region, the matrix is created.

Based on this matrix, the arithmetical unit 430 calculates the parameter similarly to FIG. 7 (S106). S104 and S106 correspond to S50 and S60 of FIG. 5. Thus the parameter can be calculated by the same process as that used in S50 and S60. The arithmetical unit 430 may be configured to carry out calculation two or more times as shown in FIG. 11.

In the next step, the server system 400 sends at least the fault-estimated board region and the parameter of the fault-estimated board region back to the client system 300 (S108).

Responsively, the client system 300 displays the fault-estimated board region and its parameter from the server system 400 on the monitor 390 (S110).

Thus the user may replace the board having a cause of defectiveness (S112).

The semiconductor testing system 1000 makes it possible for the user to make an on-line request of searches for causes of defectiveness and for the supplier to deliver an early on-line search report without the supplier and the user having to meet. In addition, since the memory unit 442 is located inside the server system 400, the supplier can easily renew fault-estimated board regions periodically, and can support the user appropriately.

All of the components of the client system 300 may be located inside the semiconductor testing system. Alternatively, some of the components of the client system 300 may be located outside. For example, the monitor 390 may be the monitor of a computer (not shown) located outside the semiconductor testing system. The memory unit 344 or 346 may be the memory of a computer located outside the semiconductor testing system.

Figure 14:
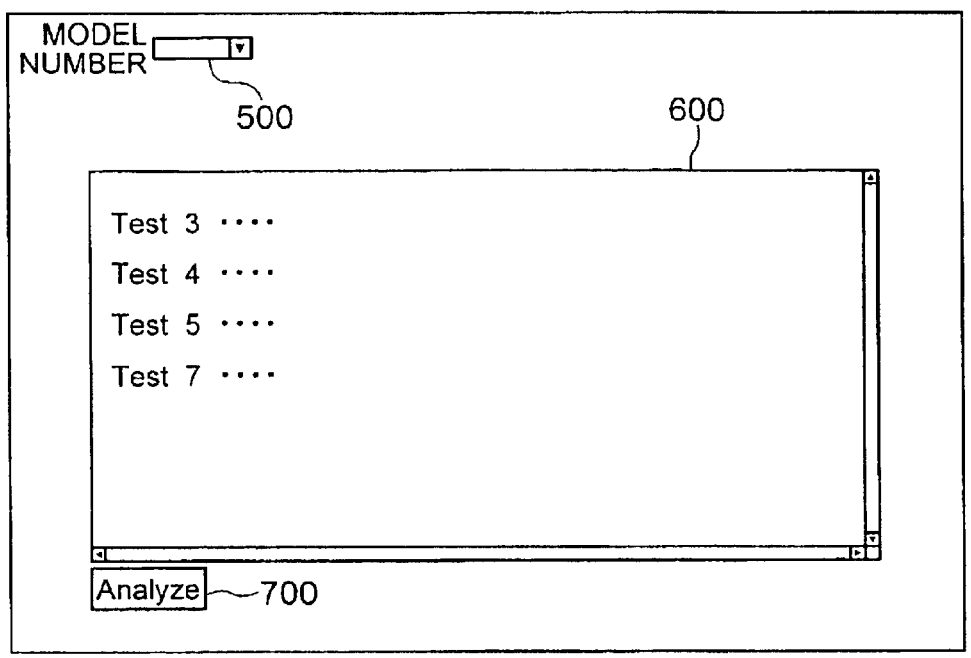
FIG. 14 is a diagram showing a screen of the monitor 390 that displays a Fail test number, etc. to be transmitted to the server system 400.

FIG. 14 is a diagram showing a screen of the monitor 390 that displays a Fail test number, etc. to be transmitted to the server system 400. The monitor 390 prepares a model number display region 500 for selection of the model number of the DUT testing unit 305, result display region 600 for displaying or inputting result information including a plurality of Fail test numbers, and transmission command region 700 to be manipulated by user's single operation to transmit the result information displayed in the result display region 600 to the server system.

After execution of a test by the board testing unit 310, Fail test numbers may be displayed on the result display region 600.

Subsequently, once the user clicks the transmission command region 700 with a mouse, steps from S102 to S110 of FIG. 13 are carried out.

The single operation by the user is the operation for selecting the transmission command display through an input device capable of communication with the client system 300. For example, the single operation may be clicking of a mouse button, depression of a key on a keyboard, producing a voice against a voice input device, or touching a touch-sensitive panel.

Heretofore, explanation has been made on semiconductor testing systems for automatic diagnosis of boards contained in the semiconductor testing systems, and methods for testing boards contained in semiconductor test systems.

The foregoing embodiments, however, are applicable for tests of DUT by semiconductor testing systems. In this case, "DUT" and "DUT regions" may replace "boards" and "board regions", respectively, and "DUT testing units" may replace "board testing units".

What is claimed is:

1. An electric parts testing system comprising:
   a testing unit to test electric parts for individual condition identifiers assigned for identification of a plurality of test conditions different from each other;
   a first memory unit which previously stores estimated causes in relation at least to each said condition identifier, said estimated causes being obtained by estimation as causes of defectiveness of the electric parts;
   a second memory unit to store at least one or more of the condition identifiers regarded as fault-connected identifiers when any of the electric parts are judged to be defective; and
   an arithmetical unit to calculate a parameter when there are a plurality of said fault-connected identifiers, said parameter being related to the fault-connected identifiers at least for each said estimated cause related to the fault-connected identifiers.

2. The electric parts testing system according to claim 1, wherein said parameter is the number of fault-connected identifiers related to said estimated causes.

3. The electric parts testing system according to claim 1, wherein said parameter is the sum of expected values indicating how often each said estimated cause is estimated to be the cause of defectiveness, or the sum of probabilities of the past causes of defectiveness, said sum being obtained for each said fault-connected identifier.

4. The electric parts testing system according to claim 1, further comprising a display unit to display at least one or more of the estimated causes having the largest or smallest parameter value.

5. The electric parts testing system according to claim 1, further comprising a display unit to display a matrix of said estimated causes and said fault-connected identifiers to show which of the estimated causes is related to which of the fault-connected identifiers.

6. The electric parts testing system according to claim 1, wherein each estimated cause is related to expected data obtained by estimation of the nature of the electric part or the test condition, or which is related data on actual results estimated on the basis of the actual past causes of defectiveness, said data on actual results being automatically renewed upon every calculation by the arithmetical unit.

7. An electric parts testing system including a server system and a client system capable of exchanging data by mutual communication, comprising:
   a testing unit contained in the client system, said testing unit testing electric parts for individual condition identifiers assigned for identification of a plurality of test conditions different from each other;
   a first memory unit contained in the server system, said first memory unit previously storing estimated causes in relation at least to each said condition identifier, said estimated causes being obtained by estimation as causes of defectiveness of the electric parts;
   a second memory unit contained in the client system, said second memory unit storing at least one or more of the condition identifiers regarded as fault-connected identifiers when any of the electric parts are judged to be defective;
   an arithmetical unit contained in the server system, said arithmetical unit calculating a parameter when there are a plurality of said fault-connected identifiers, said parameter being related to the fault-connected identifiers at least for each said estimated cause related to the fault-connected identifiers; and
   a display unit contained in the client system, said display unit displaying at least the parameter for each said estimated cause,
   wherein the server system receives the fault-connected identifiers transmitted from the client system and transmits to the client system said parameter and said estimated causes related to the fault-connected identifiers.

8. The electric parts testing system according to claim 7, wherein the display unit displays a result display region for displaying result information of the tests having a plurality of said fault-connected identifiers, and the display unit displays a transmission command region for transmitting the result information displayed on the result display region to the server system in response to an operation of the client system, and after transmission of the result information to the server system, the display unit displays at least the parameter sent from the server system and the estimated causes related to the fault-connected identifiers.

9. The electric parts testing system according to claim 8, wherein the client system transmits a transmitter identifier together with the result information in response to an operation of the client system, said transmitter identifier identifying the client system supplied with the result information from the server system.

10. The electric parts testing system according to claim 8, wherein the operation of the client system is a selection of the transmission command display through an input device that can communicate with the client system.

11. An electric parts testing method to test electric parts for individual condition identifiers assigned for identification of a plurality of test conditions different from each other, comprising:
   a first storage step of previously storing estimated causes in a memory, said estimated causes being obtained by estimation as causes of defectiveness of the electric parts and being related at least to each said condition identifiers;

a second storage step of storing in memory at least one or more of the condition identifiers regarded as fault-connected identifiers when any of the electric parts are judged to be defective;

an arithmetical step of calculating a parameter related to the fault-connected identifiers, said parameter being calculated at least for each said estimated cause related to the fault-connected identifiers when there are a plurality of said fault-connected identifiers.

12. The electric parts testing method according to claim 11, wherein the parameter calculated in the arithmetical step is the sum of expected values indicating how often each said estimated cause is estimated to be the cause of defectiveness, or the sum of probabilities of the past causes of defectiveness, said sum being obtained for each said fault-connected identifier.

13. The electric parts testing method according to claim 11, further comprising a display step of displaying at least one or more of the estimated causes having the largest or smallest parameter value.

14. The electric parts testing method according to claim 11, wherein the estimated cause is related to expected data obtained by estimation from the nature of the electric part and the test condition, said estimated cause being replaced by data on actual results estimated from the actual past causes of defectiveness.

15. The electric parts testing method according to claim 11, wherein the arithmetical step includes:

a first arithmetic step of calculating a first parameter for each estimated cause, said first parameter being related to a plurality of the fault-connected identifiers; and a second arithmetical step of calculating a second parameter for each estimated causes, said second parameter being related to a plurality of the fault-defective identifiers excluding predetermined one or more of the fault-connected identifiers.

16. The electric parts testing method according to claim 11, wherein a server system and a client system are prepared to exchange data by mutual communication, wherein the server system executes the first storage step, wherein the client system executes the second storage step, wherein the client system executes a transmission step for transmitting a plurality of the fault-connected identifiers to the server system, wherein the server system executes a receiving step for receiving the plurality of the fault-connected identifiers transmitted from the client system, wherein the server system executes the arithmetical step, and wherein the server system executes a return step for sending at least the parameter together with the estimated causes back to the client system, said estimated causes being related to the fault-connected identifiers.

17. The electric parts testing method according to claim 16, wherein, before the transmission step, the client system executes a first display step of displaying at least a result display region for displaying a plurality of the fault-connected identifiers, and a transmission command region for transmitting the plurality of the fault-connected identifiers together with a transmitter identifier assigned to specify the client system, wherein, in the transmission step, the client system transmits data, which data are displayed in the result display region, to the server system in response to an operation of the client system, and wherein, after the return step, the client system executes a second display step for displaying the parameter sent back from the server system for individual estimated causes.

* * * * *